United States Patent [19]
Hampden-Smith et al.

[11] Patent Number: 5,358,743
[45] Date of Patent: Oct. 25, 1994

[54] SELECTIVE AND BLANKET CHEMICAL VAPOR DEPOSITION OF CU FROM ($\beta$-DIKETONATE)CU(L)$_n$ BY SILICA SURFACE MODIFICATION

[75] Inventors: Mark J. Hampden-Smith; Toivo T. Kodas, both of Albuquerque, N. Mex.

[73] Assignee: University of New Mexico, Albuquerque, N. Mex.

[21] Appl. No.: 980,087

[22] Filed: Nov. 24, 1992

[51] Int. Cl.$^5$ .............................. C23C 14/04
[52] U.S. Cl. .................... 427/282; 427/250; 427/255.1; 427/300
[58] Field of Search ............ 427/250, 252, 255.1, 427/282, 300, 99

[56] References Cited

U.S. PATENT DOCUMENTS

| | | | |
|---|---|---|---|
| 5,098,516 | 3/1992 | Norman et al. | 427/252 |
| 5,100,501 | 3/1992 | Blumenthal et al. | 427/99 |

*Primary Examiner*—Shrive Beck
*Assistant Examiner*—Brian K. Talbot
*Attorney, Agent, or Firm*—Albert Sopp; Robert E. Becker

[57] ABSTRACT

In microelectronic manufacture, vertical interconnects in integrated circuits are made by the selective deposition of copper onto $SiO_2$, which is controlled by reacting the $SiO_2$ surface with chlorotrimethylsilane or dimethyldichlorosilane. These silanes interact with the surface hydroxyl groups to reduce the number of sites at which (hfac)Cu(VTMS) can adsorb and react, therefore providing selectivity.

16 Claims, 7 Drawing Sheets

SELECTIVE AND BLANKET CHEMICAL VAPOR DEPOSITION OF CU FROM (β-DIKETONATE)CU(L)$_n$ BY SILICA SURFACE MODIFICATION

FIELD OF THE INVENTION

This invention is in the field of deposition of metals on substrates to provide vertical interconnects such as in microelectronic integrated circuits.

BACKGROUND OF THE INVENTION

Chemical Vapor Deposition (CVD) from metal-organic compounds allows formation of thin films of a variety of materials by decomposition of molecular, metal-organic species. The primary advantages of CVD over other methods, such as physical vapor deposition (PVD), are that conformal coverage of complex structures is enabled and selective deposition is possible. These two aspects are particularly important in electronics applications in which surfaces with complex microelectronic topographies must be coated. An example is the formation of metal interconnect structures, which consist of a three dimensional network of metal features.

The metals of primary interest for interconnect structures are W, Al and Cu. Each has distinct advantages and disadvantages. Selective and blanket deposition of high purity tungsten using WF$_6$ has been demonstrated, and CVD of Al has been studied extensively. However, the resistivities of tungsten and aluminum are too high for many proposed metallization schemes. Thus, CVD of Cu is the subject of much current interest due to its low resistivity (1.67 μohmcm at 20° C.) relative to other metals (W, 5.65 μohmcm; Al, 2.65 μohmcm) and its good resistance to electromigration relative to aluminum.

A series of precursor metal-organic copper(I) compounds, (β-diketonate)CuL$_n$, where L=Lewis base, n=1 or 2, have recently been identified that are suitable for the chemical vapor deposition of copper and are capable of systematic substitution of β-diketonate and L where L=PMe$_3$, 1,5-Cyclooctadiene (COD), vinyltrimethylsilane (VTMS) and 2-butyne to tailor volatility and reactivity. These compounds are discussed in the following publications: Shin. H. K.; Chi, K. M.; Farkas, J.; Hampden-Smith, M. J.; Kodas, T. T.; Duesler, E. N. *Inorg. Chem.*, 1992, 31, 424; Shin, H. K.; Chi, K. M.; Hampden-Smith, M. J.; Kodas, T. T.; Paffett, M. F.; Farr, J. D. *Angew. Chem. Advanced Materials*, 1991, 3, 246; Jain, A.; Chi, K. M.; Hampden-Smith, M. J.; Kodas, T. T.; Paffett, M. F.; Farr, J. D. *Chem. Mat.* 1991, 3, 995; Chi, K. M.; Shin, H. K.; Hampden-Smith, M. J.; Kodas, T. T.; Duesler, E. N. *Polyhedron*, 1991, 10, 2293; Chi, K. M. Shin, H. K.; Hampden-Smith, M. J.; Kodas, T. T.; Duesler, E. N. *Inorg. Chem.*, 1991, 30, 4293; Jain. A.; Chi, K. M.; Hampden-Smith, M. J.; Kodas, T. T.; Paffett, M. F.; Farr, J. D., *J. Mater. Res.*, 1992, 7, 261.

The precursors discussed in the foregoing publications can deposit copper via thermally induced disproportionation reactions such as:

$$2(\beta\text{-diketonate})Cu^I L_n \rightarrow Cu^0 + Cu^{II}(\beta\text{-diketonate})_2 + 2nL \quad (1)$$

Ligand decomposition is not required, since thermally-induced disproportionation occurs at temperatures at which the volatile Lewis base and the copper(II) product are transported out of the reactor intact.

The deposition characteristics of these compounds on unmodified SiO$_2$/metal substrates are described in Table 1 where CVD experiments were carried out under the conditions described in Section A below:

TABLE 1

| Cu deposition on unmodified SiO$_2$ surfaces | | |
|---|---|---|
| Precursor | Deposition Characteristics | Temperature range of Deposition |
| (hfac)Cu(PMe$_3$) | Pt, W, Cu vs. unmodified SiO$_2$ | 150° C.–300° C. |
| (tfac)Cu(PMe$_3$) | Pt, W, Cu vs. unmodified SiO$_2$ | 100° C.–150° C. |
| (acac)Cu(PMe$_3$) | Pt, W, Cu vs. unmodified SiO$_2$ | <80° C. |
| (hfac)Cu(1,5-COD) | none for Pt, W, Cu vs. unmodified SiO$_2$ | 120° C.–250° C. |
| (hfac)Cu(VTMS) | none for W vs. unmodified SiO$_2$ | 120° C.–250° C. |
| (hfac)Cu(BTMS) | none for Pt, W, Cu vs. unmodified SiO$_2$ | 120° C.–250° C. |
| (hfac)Cu(2-butyne) | none for Pt, W, Cu vs. unmodified SiO$_2$ | 120° C.–250° C. |
| (hfac)Cu(2-pentyne) | none for Pt, W, Cu vs. unmodified SiO$_2$ | 120° C.–250° C. |

SUMMARY OF THE INVENTION

The present invention provides a method for controlling in a practical, broad temperature range the selective deposition of copper onto SiO$_2$ through the reaction of certain reagents, especially trimethylsilylchloride (TMS-Cl) and dimethyidichlorosilane with surface hydroxyl groups of the silica surface to prevent deposition of the above mentioned compounds onto the SiO$_2$ surface. That is, in accordance with the invention the surface of an SiO$_2$ layer is modified so that the copper is not deposited thereon, but instead is deposited only on metal substrate portions which are exposed to the copper. Copper is provided in suitable molecules for vapor deposition onto the substrate to form the vertical interconnects.

BRIEF DESCRIPTION OF THE DRAWINGS

Reference is now made to the drawings, in which like reference numerals refer to like parts, and in which.

DETAILED DESCRIPTION OF THE INVENTION

Figure 1:
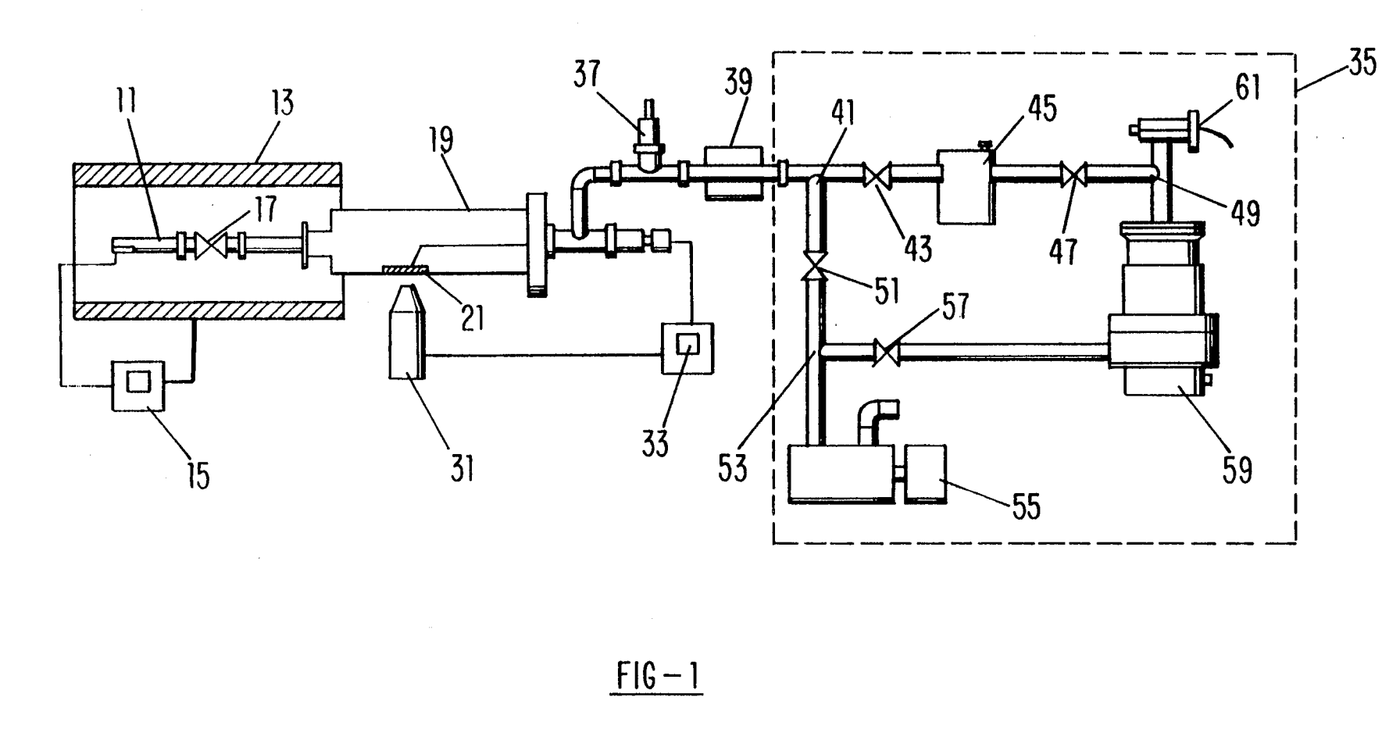
FIG. 1 is a schematic diagram of a warm-wall reactor used for CVD onto unmodified SiO$_2$ bodies.

In order to afford a better understanding and background of the present invention, the manner by which copper is deposited by the vacuum deposition process on unmodified $SiO_2$ (silicon dioxide) and W (tungsten) surfaces will first be described. Referring to FIG. 1, there is shown a conventional CVD reactor system of known design having a source chamber 11 housed inside a furnace 13 in which the solid precursor material is placed and heated under control of a temperature controller 15. The precursor materials used are (hfac)-$CuPMe_3$, (hfac)Cu(1,5-COD), (hfac)Cu(2-butyne), and (hfac)CuVTMS, as described above.

A valve 17 located within the furnace 13 when opened enables the heated, vaporized precursor materials to enter a reactor 19 in which there is positioned a substrate 21 comprised of Si having a thin film 23 of $SiO_2$ thereon. The substrate 21 has attached thereto a thermocouple, 25, for temperature measurement and a large number of openings or vias 27 therein, shown in more detail in FIG. 2, etched into the $SiO_2$ layer 23. Each via 27 contains a thin film of tungsten overlying the Si and onto which it is desired to cause vapor deposit of elemental copper, establishing conductive vertical interconnection bodies. The substrate 21 is heated by a lamp 31 of any suitable well known design controlled by a controller 33 which is further provided with means of any suitable well known construction to heat the wafer 21 and the walls of the reactor 19. A vacuum is maintained within the reactor vessel 19 by any suitable well known vacuum producing and maintaining apparatus generally indicated by the numeral 35.

More particularly, the vacuum pumping apparatus 35 serves the purpose of evacuating the deposition chamber 19, and includes, fluidly coupled to the reactor (19), first a Baratron gauge 37, a cold trap 39, and a tee 41. One conduit from the tee 41 has a valve 43. a molecular sieve 45, and a valve 47 coupled to a tee 49. The other conduit from the tee 41 is passed by way of a valve 51 to a tee 53, one leg of the tee 53 being fluidly coupled to a mechanical pump 55 and the other, by way of a valve 57 to a turbo molecular pump 59. The vacuum side of the pump 59 is coupled to one leg of the tee 49, the other leg being connected to an ionization gauge 61.

The pumping system 35 operates in a well known manner through the use of oil and turbomolecular pumping systems. Prior to deposition, the $SiO_2$ substrates were subjected to a wet cleaning procedure in a boiling 4% aqueous hydrogen peroxide solution for approximately 90 seconds, rinsed with deionized water, dried with $N_2$ gas, and then quickly introduced into the reactor.

Deposition is carried out in the following manner. Any of the precursors described above (approximately 500 mg to 1 g) is loaded into the source chamber 11 in a nitrogen atmosphere dry box and the valve 17 closed. The source chamber 11 is coupled to the main reactor 19 which is pumped down to a base pressure of $2\times 10^{-5}$ Torr. The source chamber is chilled with liquid nitrogen and evacuated through 17 to the main chamber base pressure level. The valve 17 is closed and the precursor in source chamber 11 heated to a constant temperature in a cylindrical furnace while the substrate in the reactor 19 is heated by the lamp to the desired temperature, approximately 150°–200° C. Valve 17 is then opened to start the deposition once thermal equilibrium in chambers 11 and 19 is attained. The precursor partial pressure is kept constant by adjusting the valve 51 upstream of the cold trap to change the pumping speed while the temperature was measured by a thermocouple touching the front side of the substrate.

Figure 2:
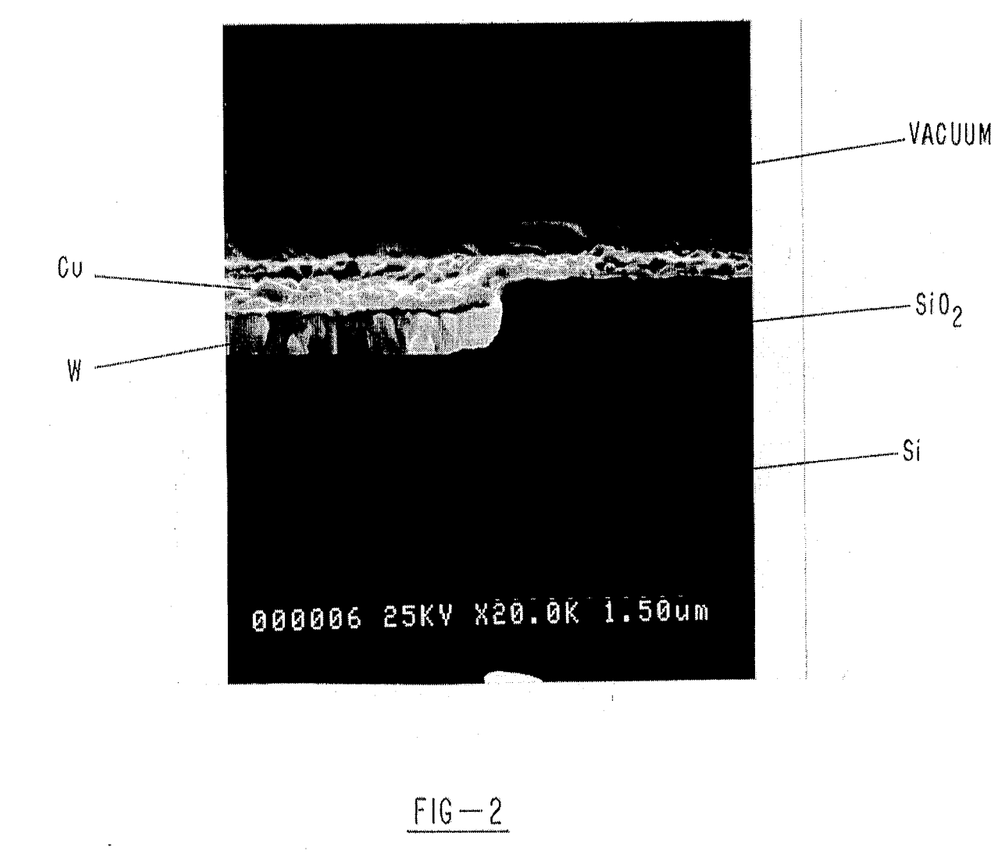
FIG. 2 is an SEM showing a cross section of non-selective deposition of Cu onto W from (hfac)-Cu(VTMS) in the presence of an unmodified SiO$_2$ surface.

The precursors, (hfac)$CuPMe_3$, (hfac)Cu(1,5-COD), (hfac)Cu(2-butyne) and (hfac)CuVTMS were explored for selective deposition for tungsten surfaces in presence of unmodified $SiO_2$ using the above test wafers, cleaning procedure and reactor system described above. Among these compounds only (hfac)$CuPMe_3$ exhibited selective behavior for tungsten, but only for several minutes of deposition time. The other compounds deposited copper immediately after the start of deposition process on both *unmodified* $SiO_2$ and tungsten surfaces. Thus, there is no selectivity for copper deposition if the $SiO_2$ is not modified. Table 1 summarizes the temperature and pressure range over which the deposition was attempted for each compound. FIG. 2, on the other hand, shows SEM of a typical via hole with conformal coverage clearly showing blanket mode (i.e. non-selective) deposition of copper by (hfac)-CuVTMS.

In order to provide selective deposition of copper onto metals in the presence of $SiO_2$ in accordance with the invention, the Si substrate with its $SiO_2$ surface layer is modified by first dipping it in a functionalized organosilane where the functional group is any one or a combination of a halide, alkoxide, or an amide, such as boiling trimethylchlorosilane (TMS-C1) or dimethyldichlorsilane. This is carried out for approximately 15 minutes, followed by drying with $N_2$ gas. The substrate is then subjected to a wet cleaning procedure in a boiling 4% aqueous hydrogen peroxide solution for approximately 90 seconds, rinsed with deionized water, dried with $N_2$ gas and then quickly introduced into the reactor chamber.

Figure 3:
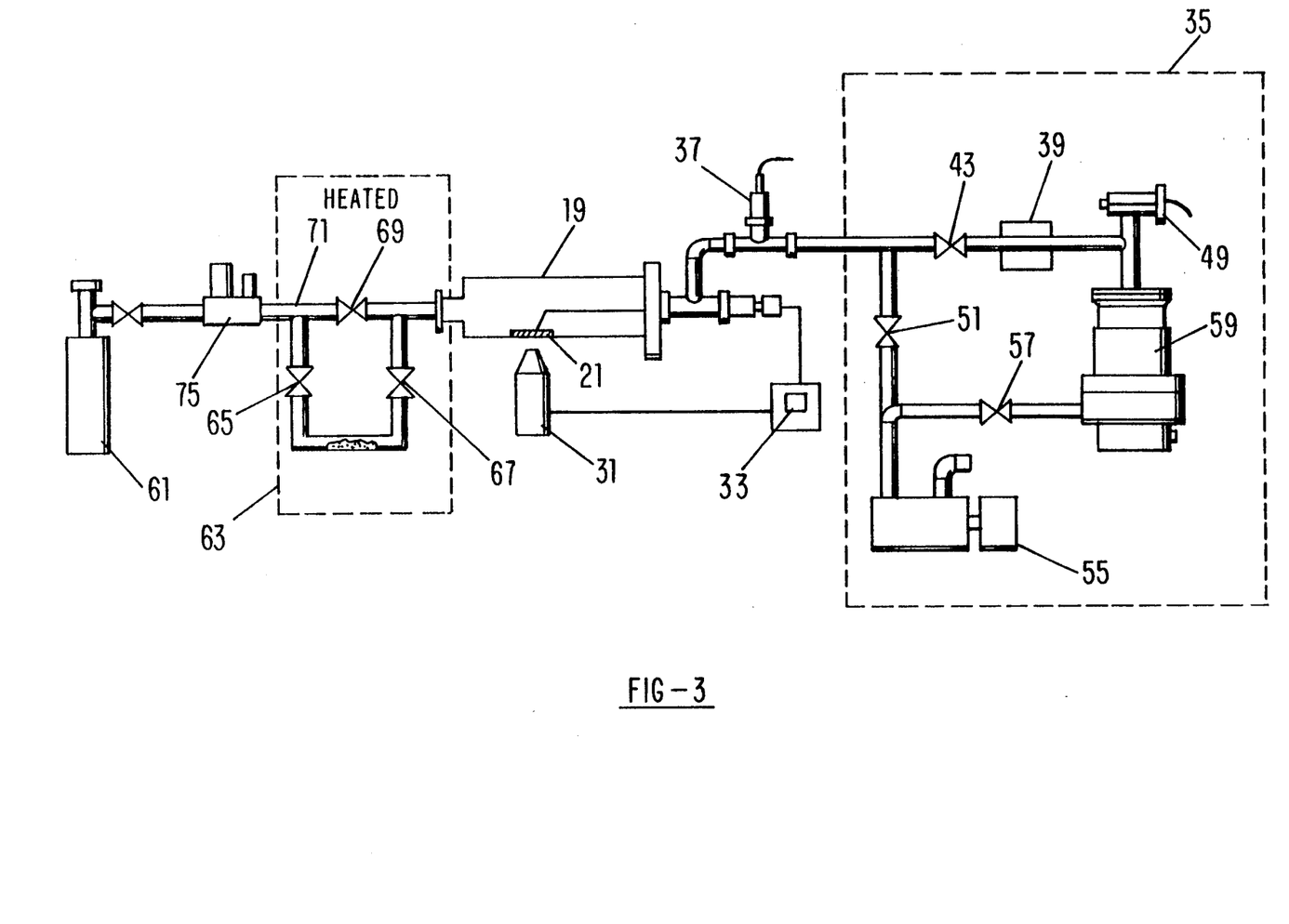
FIG. 3 is a schematic diagram of a warm-wall CVD reactor used for selective CVD onto modified SiO$_2$ substrate in accordance with the invention.

Selective deposition of copper is carried out in accordance with the invention using the apparatus shown in FIG. 3, which shows a reactor system similar to that shown in FIG. 1 but modified for use with $N_2$ carrier gas. The system in FIG. 3 includes a source chamber 61 consisting of a U - tube 63 with two pot valves 65 and 67 in each leg of the tee and a line valve, 69, in the main conduit, 71. The compound (hfac)CuL (approximatelly 500 mg to 1 g) is loaded into a source chamber 61 in a $N_2$ atmosphere dry box with valves 65 and 67 closed. The source chamber 61 is then connected to the main chamber and cooled with liquid $N_2$.

As in FIG. 1, the reactor system, FIG. 3 is provided with a vacuum pumping system, 35, which is almost identical to the pumping apparatus 35 shown in FIG. 1 except for the absence of the molecular sieve trap. The reference numerals for the other components of the pumping apparatus 35 are the same as that for the apparatus 35 in FIG. 1. The mass flow controller valve 75 along with the source pot valves 65 and 67 are kept closed while valves 69 and 43 are opened to evacuate the reaction chamber 19 to the millitorr pressure range. Valves 65 and 69 are then opened to evacuate the source chamber and reactor chamber to base pressures of $1\times 10^{-5}$ Torr while keeping the source compound chilled. The source pot valves 65 and 67 are then closed. The $N_2$ flow rate to the reactor 19 is adjusted by the mass flow controller 75 to 270 sccm and the $N_2$ partial pressure to 100 mTorr is adjusted by line controlling valve 69. The substrate, 21, is heated to a temperature of 300° C. under base pressure vacuum and maintained at this temperature for approximately 15 minutes and then brought to a temperature of 150° C. to start the experiment. The precursor is evaporated at room temperature (approximately 27° C.). A constant pumping speed for both precursor and carrier gas is achieved by using a liquid nitrogen cold trap 39 upstream of a turbomolecular pump 59 which condenses all of the precursor on the walls of the cold trap 39, allowing only $N_2$ to be pumped by the turbomolecular pump. Since both the inlet flow rate and the pumping speed of $N_2$ are kept constant, any increase in pressure measured by the Baratron 37 is solely due to the partial pressure of the precursor. The partial pressure of all the precursors is kept less than <1 mTorr because of the lower sublimation/evaporation temperature of the source chamber and higher pumping speed.

In a modification of this procedure, in accordance with the invention a chlorosilane such as trimethylchlorosilane or dimethyldichlorosilane may be used in place of the nitrogen carrier gas during deposition. This has the effect of prolonging the time over which selective deposition can be obtained as described below. The selective deposition characteristics shown in Table 2 indicate deposition for the precursor as indicated using either $N_2$ carrier gas or chlorosilanes.

TABLE 2

| Selectivity for modified $SiO_2$ surfaces | | |
|---|---|---|
| Precursor | Selectivity | Temperature range |
| (hfac)Cu(PMe₃) | Pt, W, Cu vs. $SiO_2$ | 150–300° C. |
| (hfac)Cu(1,5-COD) | W vs. $SiO_2$ | 120–250° C. |
| (hfac)Cu(VTMS) | W vs. $SiO_2$ | 120–250° C. |
| (hfac)Cu(2-butyne) | W vs. $SiO_2$ | 120–250° C. |

Figure 4A:
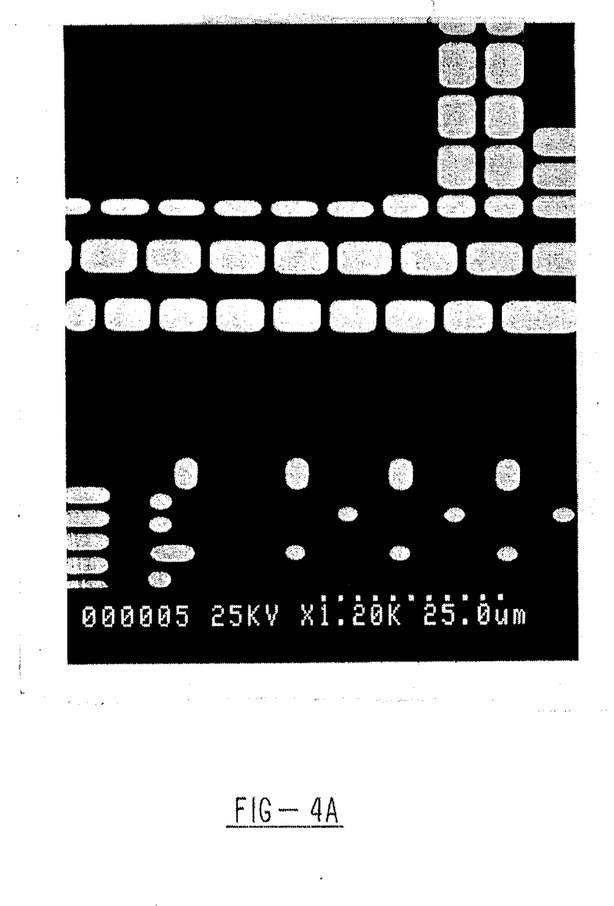
FIGS. 4A and 4B are SEMs showing top views (FIG. 4A is greater magnification than FIG. 4B) of selective deposition of Cu onto W from (hfac)Cu(2-butyne) in the presence of a modified SiO$_2$ surface.
Figure 4B:
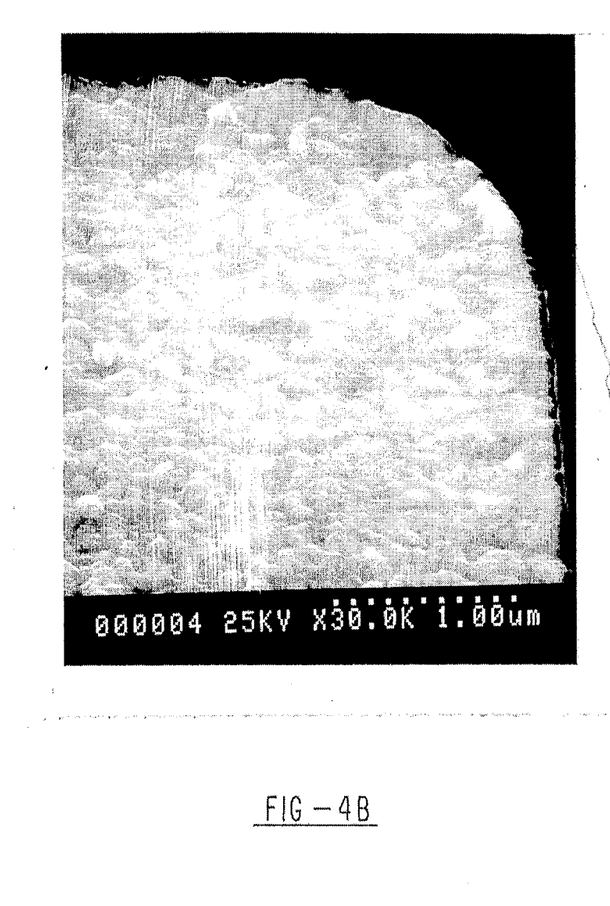
Figure 5:
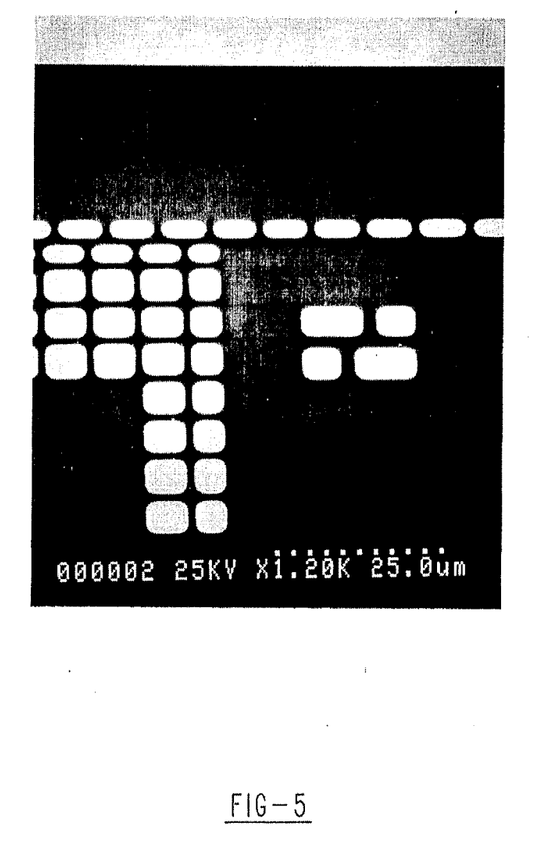
FIG. 5 is an SEM showing a top view of selective deposition of Cu onto W from (hfac)Cu(VTMS) in the presence of a modified SiO$_2$ surface.

FIGS. 4A and 4B and FIG. 5 show SEM photos of selective copper deposition on tungsten in the presence of modified $SiO_2$ for (hfac)Cu(2-butyne) and (hfac)-CuVTMS compounds respectively.

Figure 6:
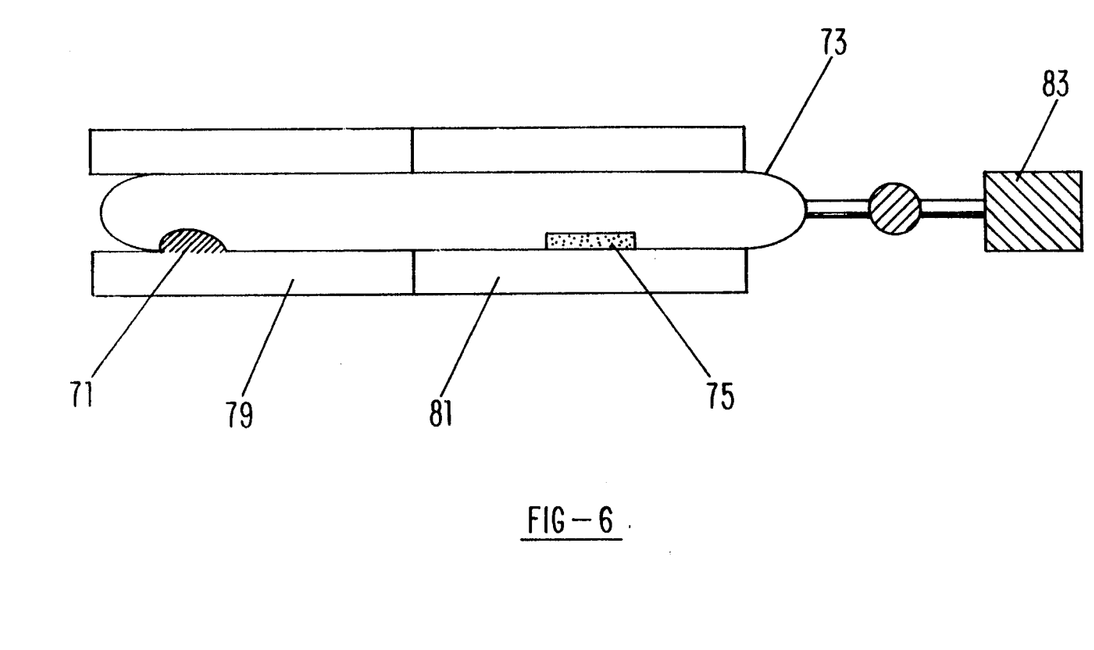
FIG. 6 is a schematic diagram of hot-wall CVD apparatus used for CVD onto modified and unmodffied SiO$_2$ substrates.

CVD similar to the "wall" systems of FIGS. 1 and 3 may be carried out in a conventional hot-wall chemical vapor deposition reactor on the substrates treated by the two different methods described above. The arrangement of the hot-wall CVD reactor is shown in FIG. 6 and operates as follows. There is provided a nitrogen-atmosphere glove box. Precursor 71 is placed at one end of a glass reactor tube 73 containing a substrate 75 having exposed metallic portion and $SiO_2$ thereon. The glass reactor tube 73 is placed inside a two-zone furnace 77 having a low temperature region 79 and high temperature or "hot" region 81. The glass tube is evacuated to about $10^{-3}$ torr by a pumping system 83 which may be identical to those described in FIGS. 1 and 4. The deposition of the copper from precursor, preheated to about 45° C., is stopped when all the precursor is evaporated. After deposition, the glass reactor tube is cooled to room temperature and disconnected from the vacuum system. No carrier gas is used. Deposition is carded out at 150° C. Deposition times range from 5–30 minutes.

It is noted that on unmodified silica surfaces, as indicated at the top of Table 1, only (hfac)Cu(PMe₃) deposited copper selectively onto W features, whereas the compounds (hfac)Cu(VTMS), (hfac)Cu(1,5-COD) and (hfac)Cu(2-butyne) produced blanket copper films on both W and unmodified $SiO_2$ substrates.

Figure 7A:
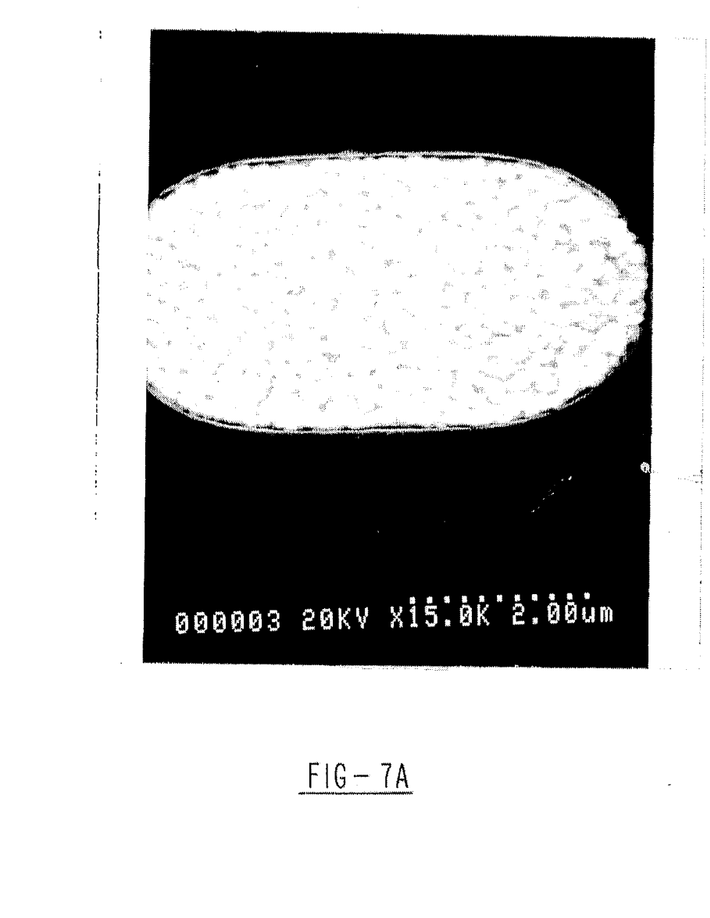
FIGS. 7A and 7B are SEMs showing selective Cu CVD from (hfac)Cu(1,5-COD) onto modified SiO$_2$ surfaces.
Figure 7B:
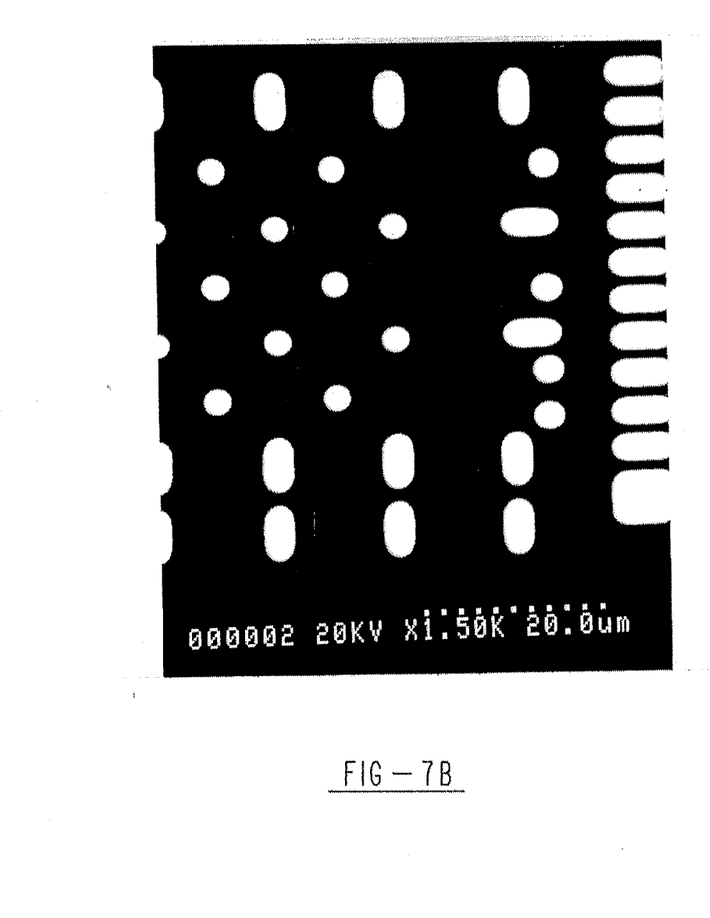

On $SiO_2$ substrates modified in accordance with the invention, selective deposition onto W was observed for both (hfac)Cu(1,5-COD) and (hfac)Cu(2-butyne) for periods ranging from 0.5–10 mins. As an example, the selective deposition of copper onto W in the presence of modified silica from (hfac)Cu(1,5-COD) is shown in FIGS. 7A and 7B.

We claim:

1. The method of selectively depositing copper onto exposed metallic substrates partially covered by a layer of silica, said method comprising the following steps:
   a. partially covering a metallic substrate with a layer of silica such that the metallic substrate is exposed partially;
   b. treating the silica with a functionalized organosilane to render the silica unreceptive to the deposition of copper thereon; and
   c. subjecting the treated silica and the exposed metallic substrate to a precursor material containing copper, whereby the copper is deposited only onto the exposed metallic substrate.

2. The method of claim 1 wherein said functionalized organosilane includes a functional group comprising any one or a combination of a halide, an alkoxide, or an amide.

3. The method of claim 2 wherein said functionalized organosilane is a chlorosilane.

4. The method of claim 2 wherein said functionalized organosilane is trimethylchlorosilane or dimethyldichlorosilane.

5. The method of claim 1 wherein said precursor material is one or more compounds selected from the group consisting of (hfac)Cu(triorganophosphine), (hfac)Cu(alkene) and (hfac)Cu(alkyne).

6. The method of claim 5 wherein said precursor material is one or more compounds selected from the group consisting of (hfac)Cu(PMe₃), (hfac)Cu(1,5-COD), (hfac)Cu(VTMS) and (hfac)CU(2-butyne).

7. The method of claim 2 wherein said precursor material is one or more compounds selected from the group consisting of (hfac)Cu(triorganophosphine), (hfac)Cu(alkene) and (hfac)Cu(alkyne).

8. The method of claim 7 wherein said precursor material is one or more compounds selected from the group consisting of (hfac)Cu(PMe3), (hfac)Cu(1,5-COD), (hfac)Cu(VTMS) and (hfac)Cu(2-butyne).

9. The method of claim 1 wherein the said precursor material is heated to about 45° C. in ambient pressure of about $10^{-3}$ torr.

10. The method of claim 1 wherein the step of subjecting the silica and exposed metallic substrate is carried out in the presence of $N_2$.

11. The method of claim 1 wherein the step of treating comprises evaporating said functionalized organosilane for deposition onto the silica.

12. The method of claim 11 wherein said step is carded out in the presence of $N_2$.

13. The method of claim 12 wherein said step is carried out in the presence of at least an equal quantity of the substance in the form of a functionalized chlorosilane relative to the quantity of $N_2$.

14. The method of claim 11 wherein the chlorosilane consists of either trimethylchlorosilane or dimethyldichlorosilane.

15. The method of selectively depositing copper onto exposed metallic substrates partially covered by a layer of silica, said method comprising the following steps:
   a. treating the silica with a functionalized organosilane to render the silica unreceptive to the deposition of copper thereon, and b. subjecting the silica and the exposed metallic substrate to a precursor material containing cooper, whereby the copper is deposited only onto the metallic substrate.

16. The method according to claim 15, wherein the functional group of said functionalized organosilane is any one or a combination of a halide, an alkoxide or an amide.

* * * * *